(12) United States Patent
Beyer et al.

(10) Patent No.: US 9,123,827 B2
(45) Date of Patent: Sep. 1, 2015

(54) METHODS FOR FABRICATING INTEGRATED CIRCUITS WITH FULLY SILICIDED GATE ELECTRODE STRUCTURES

(71) Applicant: GLOBALFOUNDRIES, Inc., Grand Cayman (KY)

(72) Inventors: Sven Beyer, Dresden (DE); Jan Hoentschel, Dresden (DE); Alexander Ebermann, Dresden (DE); Carsten Grass, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 3 days.

(21) Appl. No.: 14/153,502

(22) Filed: Jan. 13, 2014

(65) Prior Publication Data

US 2015/0200142 A1    Jul. 16, 2015

(51) Int. Cl.

| | |
|---|---|
| *H01L 21/8238* | (2006.01) |
| *H01L 29/66* | (2006.01) |
| *H01L 21/306* | (2006.01) |
| *H01L 21/324* | (2006.01) |
| *H01L 21/283* | (2006.01) |
| *H01L 21/02* | (2006.01) |

(52) U.S. Cl.
CPC .. *H01L 21/823835* (2013.01); *H01L 21/02595* (2013.01); *H01L 21/283* (2013.01); *H01L 21/30604* (2013.01); *H01L 21/324* (2013.01); *H01L 29/665* (2013.01)

(58) Field of Classification Search
CPC ............... H01L 21/823814; H01L 21/32053; H01L 21/324; H01L 29/6656; H01L 21/28097; H01L 21/28518; H01L 29/517; H01L 21/28052; H01L 21/76831; H01L 21/76834; H01L 21/823437; H01L 21/823443; H01L 21/823835; H01L 29/665; H01L 21/30604; H01L 21/283; H01L 21/02595
See application file for complete search history.

(56) References Cited

U.S. PATENT DOCUMENTS

| | | | |
|---|---|---|---|
| 2004/0132274 A1* | 7/2004 | Jun et al. ..................... | 438/592 |
| 2008/0206988 A1 | 8/2008 | Kohli et al. | |
| 2013/0032901 A1 | 2/2013 | Javorka et al. | |

\* cited by examiner

*Primary Examiner* — Yasser A Abdelaziez
*Assistant Examiner* — Farun Lu
(74) *Attorney, Agent, or Firm* — Ingrassia Fisher & Lorenz, P.C.

(57) ABSTRACT

A method for fabricating an integrated circuit includes providing a semiconductor substrate including a gate electrode structure thereon and sidewall spacers along sidewalls of the gate electrode structure to a first height along the sidewalls, forming a planarizing carbon-based polymer layer over the gate electrode structure and over the sidewall spacers, and etching a portion of the optical planarization layer to expose a top portion the gate electrode structure. Further, the method includes etching an upper portion of the sidewall spacers selective to the gate electrode structure so as to expose the sidewalls of the upper portion of the gate electrode structure and depositing a silicide-forming material over the top portion of the gate electrode structure and the sidewalls of the upper portion of the gate electrode structure. Still further, the method includes annealing the silicide-forming material.

20 Claims, 4 Drawing Sheets

METHODS FOR FABRICATING INTEGRATED CIRCUITS WITH FULLY SILICIDED GATE ELECTRODE STRUCTURES

TECHNICAL FIELD

The present disclosure generally relates to methods for fabricating integrated circuits. More particularly, the present disclosure relates to methods for fabricating integrated circuits with fully silicided (FUSI) gate electrode structures.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode formed over a semiconductive substrate, and spaced apart source and drain electrodes within the substrate between which a current can flow. A control voltage applied to the gate electrode controls the flow of current through a channel in the semiconductive substrate between the source and drain electrodes.

A continuing trend in the semiconductor industry is to manufacture ICs with higher device densities by scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or "packing" more circuits on a semiconductor die and/or more die per semiconductor wafer, for example.

One way to increase packing densities is to decrease the thickness of transistor gate dielectrics to shrink the overall dimensions of transistors used in ICs and electronic devices. Transistor gate dielectrics (e.g., silicon dioxide or nitrided silicon dioxide) have recently been reduced considerably to reduce transistor sizes and facilitate improved performance. Thinning gate dielectrics can have certain drawbacks, however. In one example, a polycrystalline silicon ("polysilicon") gate overlies a thin gate dielectric, and polysilicon naturally includes a depletion region where it interfaces with the gate dielectric. As used herein, the term "overlie" refers to a layer or device that is formed vertically above another layer or device (possibly with one or more intervening layers or devices) when the integrated circuit device is oriented as depicted in the figures. This depletion region can provide an insulative effect rather than conductive behavior, which is desired of the polysilicon gate since the gate is to act as an electrode for the transistor.

By way of example, if the depletion region acts like a 0.8 nm thick insulator and the gate dielectric is 10-nm thick, then the depletion region effectively increases the overall insulation between the gate and an underlying transistor channel by eight percent (e.g., from 10 nm to 10.8 nm). It can be appreciated that as the thickness of gate dielectrics are reduced, the effect of the depletion region can have a greater impact on dielectric behavior. For example, if the thickness of the gate dielectric is reduced to 2 nm, the depletion region would effectively increase the gate insulator by about 40 percent (e.g., from 2 nm to 2.8 nm). This increased percentage significantly reduces the benefits otherwise provided by thinner gate dielectrics.

Metal gates can be used to mitigate adverse effects associated with the depletion region phenomenon because, unlike polysilicon, little to no depletion region manifests in metal. Metal gates were commonly used prior to the more recent use of polysilicon gates. An inherent limitation of such metal gates, however, led to the use of polysilicon gates. In particular, the use of a single work function metal proved to be a limitation in high performance circuits that require dual work function electrodes for low power consumption. The work function is the energy required to move an electron from the Fermi level to the vacuum level. In modern complementary MOS ("CMOS") circuits, for example, both p-channel MOS transistor devices ("PMOS") and n-channel MOS transistor devices ("NMOS") are generally used, where a PMOS transistor requires a work function on the order of 5 eV and an NMOS transistor requires a work function on the order of 4 eV. A single metal may not be found, however, which can produce a metal gate that provides such different work functions. Polysilicon gates are suited for application in CMOS devices since some of the gates can be substitutionally doped in a first manner to achieve the desired work function for PMOS transistors and other gates can be substitutionally doped in a second manner to achieve the desired work function for NMOS transistors. However, polysilicon gates suffer from the aforementioned gate depletion.

Fully silicided (FUSI) gates eliminate the problem of polysilicon depletion. FUSI gates also reduce the gate conductance that can further improve device performance. In the prior art, a FUSI gate is conventionally formed by depositing a metal layer (such as Ni, Ti, Co, etc.) over an exposed polysilicon gate region, pre-annealing to provide the required diffusion, removing the unreacted metal, and then annealing the semiconductor structure to form a more stable silicide phase. The deposited metal reacts with the exposed polysilicon gate to transform the polysilicon gate fully into a silicided gate. FUSI gates normally have a work function near the middle of the silicon band structure. However, CMOS devices normally require a conductive gate with a work function near the band edge; i.e., near the conduction band for an NMOS device and near the valence band for a PMOS device, respectively. Thus, for CMOS technologies with FUSI gates, the different work functions required for each of the NMOS and PMOS portions of the CMOS device may also need to be provided by the inclusion of various work-function modifying materials (such as work-function modifying metals) into the gate stack.

In addition, the doped silicide gate electrodes of the MOS devices are typically formed to be much thicker than the depth of the silicide formed in the source/drain (S/D) regions. Because of these differing thicknesses, the gate silicidation is usually formed separate from the S/D silicidation, typically separated by a complex and costly CMP process. If the gate silicide and the S/D silicide were formed during the same silicidation process using convention approaches, the silicide thickness in the S/D region would far exceed the desired amount, leading to possible defects. That is, with increasing the amount of silicidation of the gate electrode to a FUSI gate electrode, S/D areas cannot be silicided independent of the gate electrode, and if done simultaneously, would tend to "pipe," which is a defect mechanism wherein silicide creeps into the channel region under the gate electrode, or simply breaks through the depletion zone between body and S/D area, if too much silicidation is supplied to the S/D regions.

Accordingly, it is desirable to provide improved methods for fabricating integrated circuits using CMOS technologies. Additionally, it is desirable to be able to form a fully silicided gate of a CMOS transistor using a simple and cost effective process that may be employed in the fabrication of high density CMOS devices. Furthermore, other desirable features and characteristics of the present disclosure will become apparent from the subsequent detailed description and the appended claims, taken in conjunction with the accompanying drawings and the foregoing technical field and background.

BRIEF SUMMARY

Various exemplary methods for fabricating integrated circuits are provided herein. In one exemplary embodiment, a method for fabricating an integrated circuit includes providing a semiconductor substrate overlying a gate electrode structure thereon and sidewall spacers along sidewalls of the gate electrode structure to a first height along the sidewalls, forming an optical planarization layer (or other planarizing carbon-based polymer layer) over the gate electrode structure and over the sidewall spacers, and etching a portion of the optical planarization layer to expose a top portion (i.e., the portion most remote from the substrate) of the gate electrode structure and an upper portion of the sidewall spacers (again, in reference to that portion most remote from the substrate), the upper portion of the sidewall spacers being adjacent to sidewalls of an upper portion of the gate electrode structure. Further, the method includes etching the upper portion of the sidewall spacers selective to the gate electrode structure so as to expose the sidewalls of the upper portion of the gate electrode structure, etching a remaining portion of the optical planarization layer so as to expose a remaining portion of the sidewall spacers, and depositing a silicide-forming material over the top portion of the gate electrode structure, the sidewalls of the upper portion of the gate electrode structure, and the remaining portion of the sidewall spacers. Still further, the method includes annealing the silicide-forming material to form a fully silicided gate electrode structure.

In another exemplary embodiment, a method for fabricating an integrated circuit includes providing a semiconductor substrate overlying a polycrystalline silicon gate electrode structure, sidewall spacers along sidewalls of the gate electrode structure to a first height along the sidewalls, and source and drain regions on the semiconductor substrate adjacent to the gate electrode structure, forming a non-photo sensitive spin-on polymer optical planarization layer over the gate electrode structure, over the sidewall spacers, and over the source and drain regions, and etching a portion of the optical planarization layer using an $O_2$-based reactive ion etch to expose a top portion of the gate electrode structure and an upper portion of the sidewall spacers, the upper portion of the sidewall spacers being adjacent to sidewalls of an upper portion of the gate electrode structure. The method further includes etching the upper portion of the sidewall spacers selective to the gate electrode structure using a hydrogen fluoride-based wet etchant so as to expose the sidewalls of the upper portion of the gate electrode structure, above a second height along the sidewalls, wherein the second height is below the first height, etching a remaining portion of the optical planarization layer using an $O_2$-based plasma so as to expose a remaining portion of the sidewall spacers and the source and drain regions, and depositing a nickel silicide-forming material over the top portion of the gate electrode structure, the sidewalls of the upper portion of the gate electrode structure, the remaining portion of the sidewall spacers, and the source and drain regions. Still further, the method includes annealing the silicide-forming material to form a fully silicided gate electrode structure and silicided source and drain regions of the integrated circuit.

In yet another exemplary embodiment, a method for fabricating an integrated circuit includes providing a semiconductor substrate and forming two polycrystalline silicon a gate electrode structure on the semiconductor substrate, wherein one of the two gate electrode structures is doped with a p-type dopant and the other of the at least two gate electrode structure is doped with an n-type dopant. The method further includes forming sidewall spacers including two different materials along sidewalls of the two gate electrode structures to a first height along the sidewalls, forming source and drain regions on the semiconductor substrate adjacent to the two gate electrode structures, and forming a non-photo sensitive spin-on polymer optical planarization layer over the two gate electrode structures, over the sidewall spacers, and over the source and drain regions. The method further includes etching a portion of the optical planarization layer using an $O_2$-based reactive ion etch to expose a top portion of each of the two gate electrode structures and an upper portion of the sidewall spacers, the upper portion of the sidewall spacers being adjacent to sidewalls of an upper portion of each of the two gate electrode structures, etching the upper portion of the sidewall spacers selective to the two gate electrode structures using a hydrogen fluoride-based wet etchant so as to expose the sidewalls of the upper portions of each of the two gate electrode structure, above a second height along the sidewalls, wherein the second height is below the first height, and etching a remaining portion of the optical planarization layer using an $O_2$-based plasma so as to expose a remaining portion of the sidewall spacers and the source and drain regions. Still further, the method includes depositing a nickel silicide-forming material over the top portion of each of the two gate electrode structures, the sidewalls of the upper portion of each of the two gate electrode structures, the remaining portion of the sidewall spacers, and the source and drain regions and annealing the silicide-forming material to form two fully silicided gate electrode structures and silicided source and drain regions in the process of forming a completed integrated circuit structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
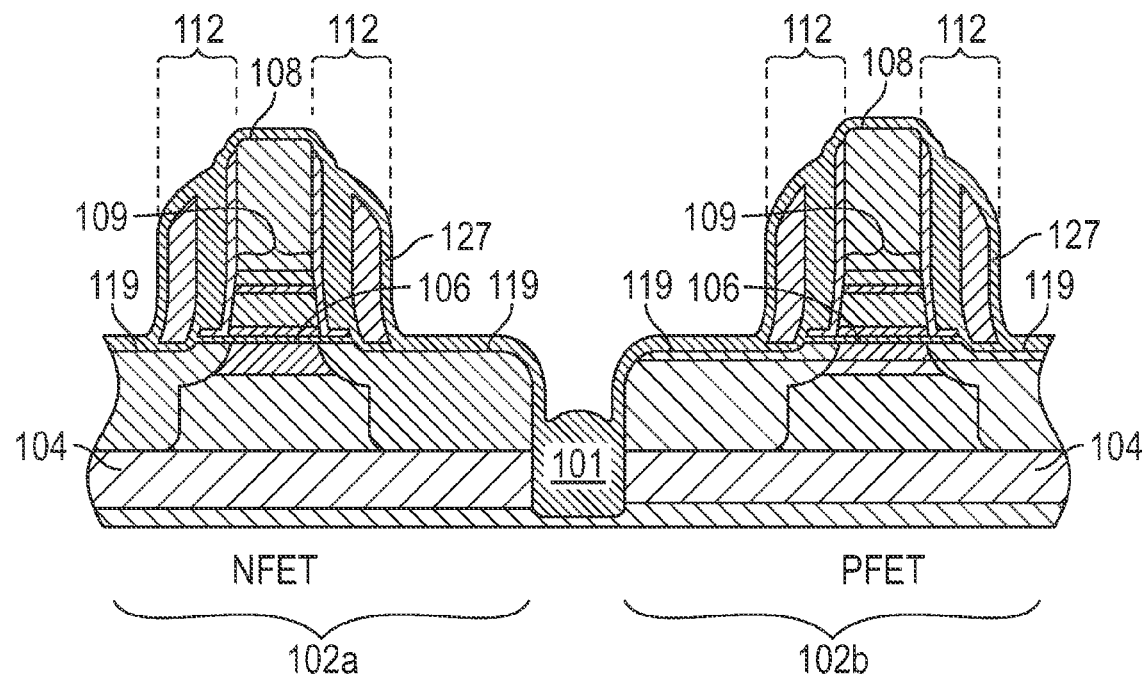
FIGS. 1-7 illustrate, in cross section, integrated circuit structures and methods for fabricating an integrated circuit in accordance with various embodiments of the present disclosure.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are directed to methods for fabricating integrated circuits with fully silicided (FUSI) gate electrode structures. In contrast to conventional gate silicidation techniques, which only expose enough of the gate structure to form a silicide region on a top portion of the gate structure, or which use separate silicidation processes at the gate region and at the source/drain region, the embodiments described herein provide methods to "pull back" (i.e., reduce the height of) the gate sidewall spacers far enough to enable FUSI gates structures from the sides of the gate electrode while simultaneously forming the silicide for the source/drain region. In the described embodiments, the gate structures are coated with a planarizing carbon-based polymer, such as an optical planarization layer (OPL), which is a non-photo sensitive spin-on polymer material, which is then etched-back using an $O_2$-based reactive ion etching process (RIE) until the gate sidewall spacers are exposed from the OPL. Then, either a RIE etching process or a wet etching process is used to "pull back" the top of the spacers. Subsequently, the OPL is removed with $O_2$ plasma. The described embodiments thereafter follow conventional silicide integration techniques. By pulling back the spacer structures to expose the gate electrode, while leaving a portion of the spacer structures in place, the above-noted problem of "piping" is substantially avoided at the source/drain region, thus reducing defects in the completed semiconductor device.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

The techniques and technologies described herein may be utilized to fabricate MOS transistor devices, including NMOS transistor devices, PMOS transistor devices, and CMOS transistor devices. In particular, the process steps described here may be utilized in conjunction with any semiconductor device fabrication process that forms gate structures for transistors. Although the term "MOS device" properly refers to a device having a metal gate electrode and an oxide gate insulator, that term will be used throughout this disclosure to refer to any semiconductor device fabricated in a "gate-first" process flow in accordance with embodiments of the present disclosure.

FIG. 1 illustrates a partially-formed integrated circuit that has been formed in a "gate first" process, as is known in the art, beginning with the formation of gate insulation layer 106 formed over a semiconductor substrate 104 and electrically isolated by one or more isolation features 101, such as shallow-trench isolation (STI) features. For instance, the substrate 104 may represent a semiconductor material, for instance, a silicon material in combination with an appropriate silicon-based layer in and above which transistor elements may be formed. In other cases, a buried insulating layer (not shown) may be formed between the substrate material and a corresponding "active" silicon-based material layer, thereby providing a silicon-on-insulator (SOI) configuration. In an exemplary embodiment, the gate insulation layer is an atomic layer deposition (ALD)-deposited high-k metal oxide layer (i.e., having a higher dielectric constant that silicon oxide), such as an $Al_2O_3$ layer, or other high-k material known in the art. The overall thickness of the gate insulation layer may be from about 1 nm to about 3 nm.

Continuing with the description of the exemplary partially-formed integrated circuit shown in FIG. 1, one or more work function modifying materials 109 is/are optionally deposited subsequent to the formation of the gate insulation layer and may include one or more of La and Al, for example, or other materials as are known in the art. The work function modifying material(s) may be deposited using a suitable deposition technique such as atomic layer deposition (ALD), chemical vapor deposition (CVD), low-pressure CVD (LPCVD), semi-atmospheric chemical vapor deposition (SACVD), or plasma-enhanced CVD (PECVD). The work function modifying material(s) 109 may be deposited to a thickness sufficient to achieve the desired work function modification effect, such as from about 2 Å to about 2 nm.

Thereafter, a gate electrode material layer 108, such as polycrystalline silicon, may be formed using conventional deposition techniques, such as CVD. The gate electrode material layer 108 may be formed to a thickness from about 5 nm to about 50 nm. A capping layer (not illustrated) may thereafter be optionally deposited using a material such as a silicon nitride material or a silicon oxide material.

Subsequent to the deposition of the gate electrode material, one or more gate stack structures may be formed using known photolithographic patterning and etching procedures. That is, a photoresist layer is deposited and then is exposed to an image pattern and treated with a developing solution to form pattern openings within the photoresist layer. With the openings thus formed, the deposited layer may be etched to form gate stack structures by, for example, RIE using a suitable etching chemistry.

With continued reference to FIG. 1, one or more spacer structures 112 (for example, three are illustrated in the Figures) may be formed adjacent to the gate stacks by conformally depositing one or more dielectric materials over the substrate 104 and the gate stacks, where the dielectric material(s) is/are an appropriate insulator(s), such as silicon nitride, silicon oxide, or a combination thereof, or two or more thereof. The dielectric spacer material(s) may be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacer structure(s) 112 formed from the layer have a thickness that is appropriate for the subsequent process steps described below. In some embodiments, the layer of dielectric spacer material is deposited to a thickness of about 5 nm to about 50 nm. Anisotropic etching of the layer(s) of dielectric spacer material(s) may be used to form the spacer structures 112, as illustrated in FIG. 1. The layer(s) of dielectric spacer material(s) may be etched by, for example, RIE using a suitable etching chemistry.

The spacer structures 112 may be provided to protect the underlying semiconductor material 104 during ion implantation processes associated with the formation of source/drain extension implant regions, halo implant regions, and/or deep source/drain implant regions, as is well understood but not separately illustrated in the Figures. The spacer(s) 112 may be aligned for this purpose, as is known in the art. Ion implantation to form the source/drain extension implant regions, halo implant regions, and/or deep source/drain implant regions may be realized by exposing the semiconductor substrate to a dopant ion implantation process. For example, the implant regions may be performed by exposing germanium substrate 104 to an ionizing environment with an ionic dopant species that is directed downward towards the germanium substrate 104. Suitable dopants for this process may include the various ions of boron (B), aluminum (Al), and/or indium (In) to form a pFET, and phosphorus (P), arsenic (As), and/or antimony (Sb) to form an nFET.

In particular, the partially-formed integrated circuit illustrated in FIG. 1 shows a CMOS device, wherein FET 102a is an n-type FET and FET 102b is a p-type FET. In accordance with the forgoing illustrations, FETs 102a and 102b may include gate dielectric layers at the gate-to-substrate interface. As noted above, gate dielectric layers may include a high-k oxide material, for example aluminum or hafnium oxide. As also noted above, FETs 102a and 102b may further include polycrystalline silicon gate electrode structures 108, formed on the gate dielectric layers. If a capping layer was initially present, such layer is removed etching, e.g., using hot phosphoric acid ($H_3PO_4$), or hydrofluoric acid (HF).

As further shown in FIG. 1, a sacrificial liner 127 is formed on the polycrystalline silicon gate electrodes 108 of FETs 102a and 102b, on each side of FETs 102a and 102b (namely along the sidewall spacers 112 thereof), and on source/drain regions 119. Liner 127 may be formed of an oxide, for example silicon oxide ($SiO_2$), and may be formed by thermal oxidation or a deposition process to a thickness of about 10 Å to about 50 Å. As such, in an exemplary process for fabricating an integrated circuit as described in the present disclosure, the exemplary method may begin with a step of forming a partially-formed integrated circuit as shown in FIG. 1 and as described above, or using any other suitable gate-first process as may be known in the art.

Figure 2:
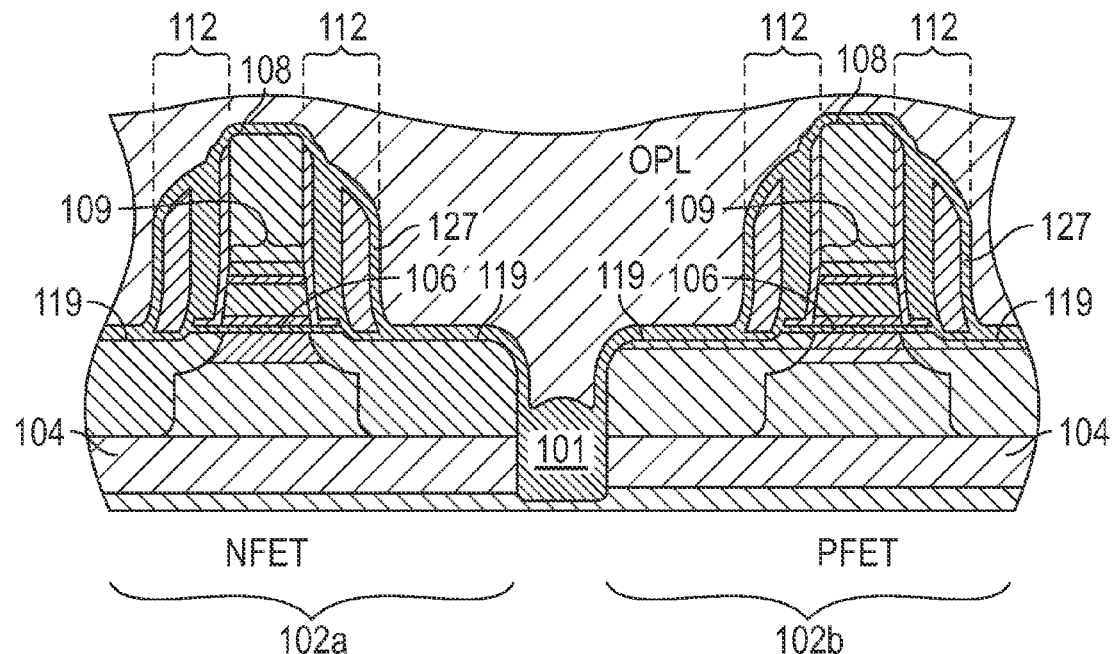

With reference now to FIG. 2, the exemplary process continues with forming a planarizing carbon-based polymer layer, such as an non-photo sensitive spin-on polymer optical planarization layer (OPL) 129, over the liner 127, and in particular over the gate electrode structures 108, over the sidewall spacers 112, and over the source and drain regions 119. (While any planarizing carbon-based polymer material may be employed, layer 129 is hereinafter referred to as an OPL for convenience of describing an exemplary embodiment.) In this regard, the layer 129 is formed on liner 127, on each side of FETs 102a and 102b, to a thickness that is sufficient to cover the FETs 102a and 102b, for example, about 500 Å to about 2000 Å. The optical planarization material for layer 129 is typically provided as an organic material that may be applied on the basis of spin-on techniques in a low viscous state, as are known in the art.

Figure 3:
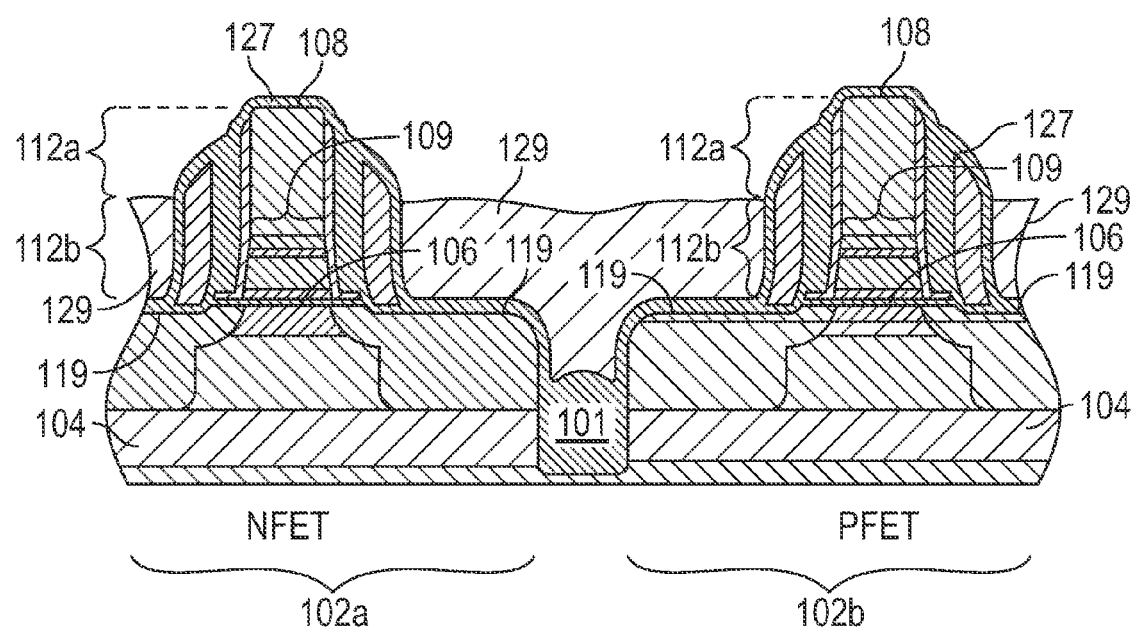

The exemplary process continues with reference to FIG. 3 with a step of etching a portion of the optical planarization layer 129 to expose a top portion of each of the two FET structures 102a, 102b (still at this point covered by the liner 127) and an upper portion of the sidewall spacers 112a, the upper portion of the sidewall spacers being adjacent to sidewalls of an upper portion of each of the two gate electrode structures. The source/drain regions 119 and a lower portion of the sidewall spacers 112b remain covered by the OPL 129. This etching process may be performed using an $O_2$-based reactive ion etch, for example.

Figure 4:
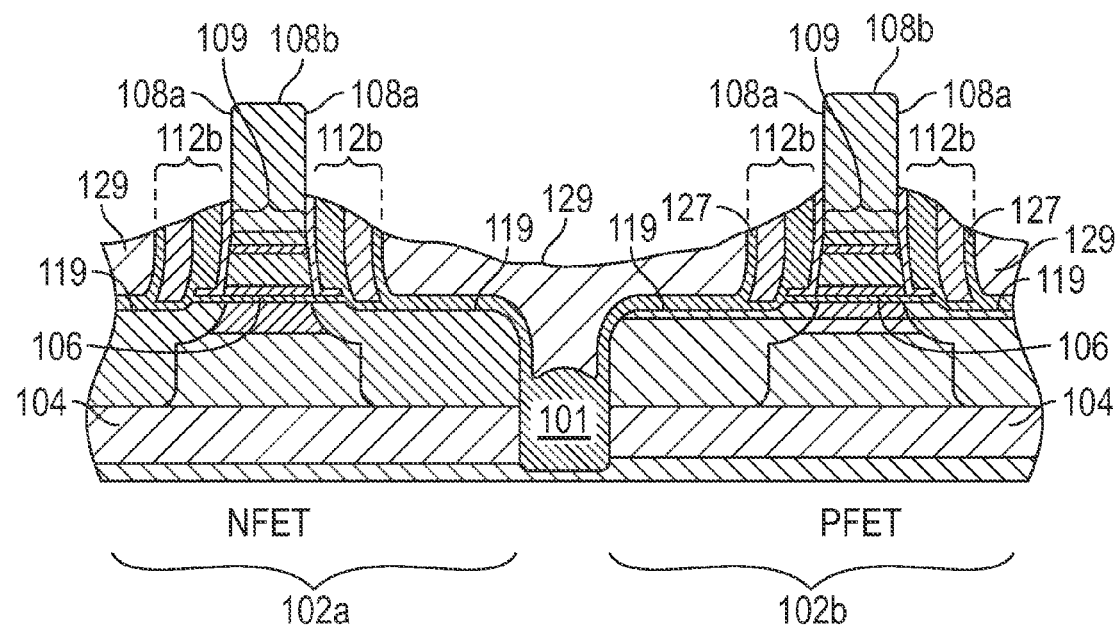

Thereafter, with reference to FIG. 4, the process continues with etching the upper portion of the sidewall spacers 112a (and the liner 127 thereunder) selective to the two gate electrode structures 108 so as to expose the sidewalls of the upper portions of each of the two gate electrode structures 108a as well as top portions 108b of the gate electrode structures 108. At this stage as well, the source/drain regions 119 and a lower portion of the sidewall spacers 112b remain covered by the OPL 129. This etching process may be performed using a hydrogen fluoride (HF)-based wet etchant, for example.

Figure 5:
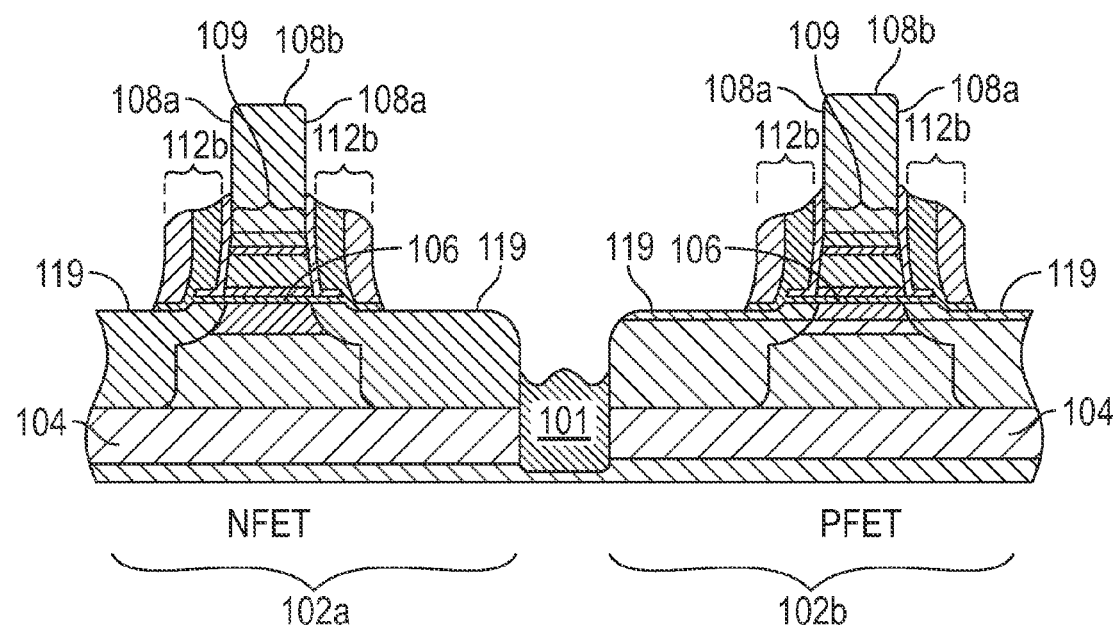

Thereafter, a further etching procedure is performed as shown in FIG. 5, namely etching away any remaining portion of the optical planarization layer (and the liner 127 thereunder) so as to expose the lower portion of the sidewall spacers 112b and the source and drain regions 119. This etching process may be performed using an $O_2$-based plasma, for example. Thus, the structure shown in FIG. 5 includes the gate electrode structures 108 with the top portions 108b exposed and the side portions 108a exposed, the sidewall spacer structures "pulled back" with only a lower portion 112b thereof remaining, and the source/drain regions 119 exposed.

Figure 6:
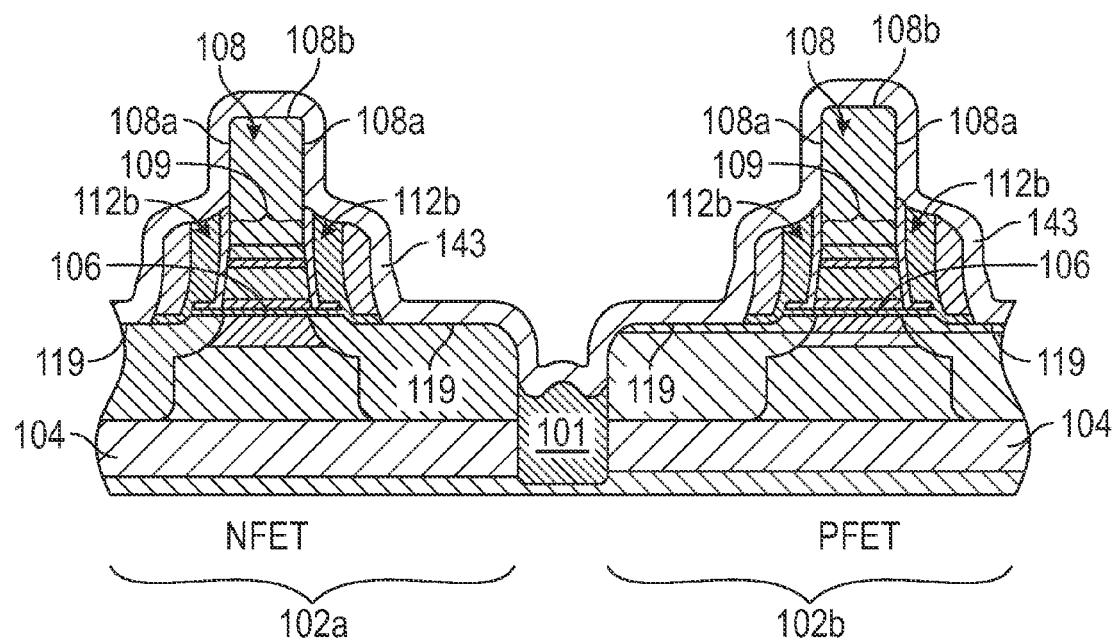
Figure 7:
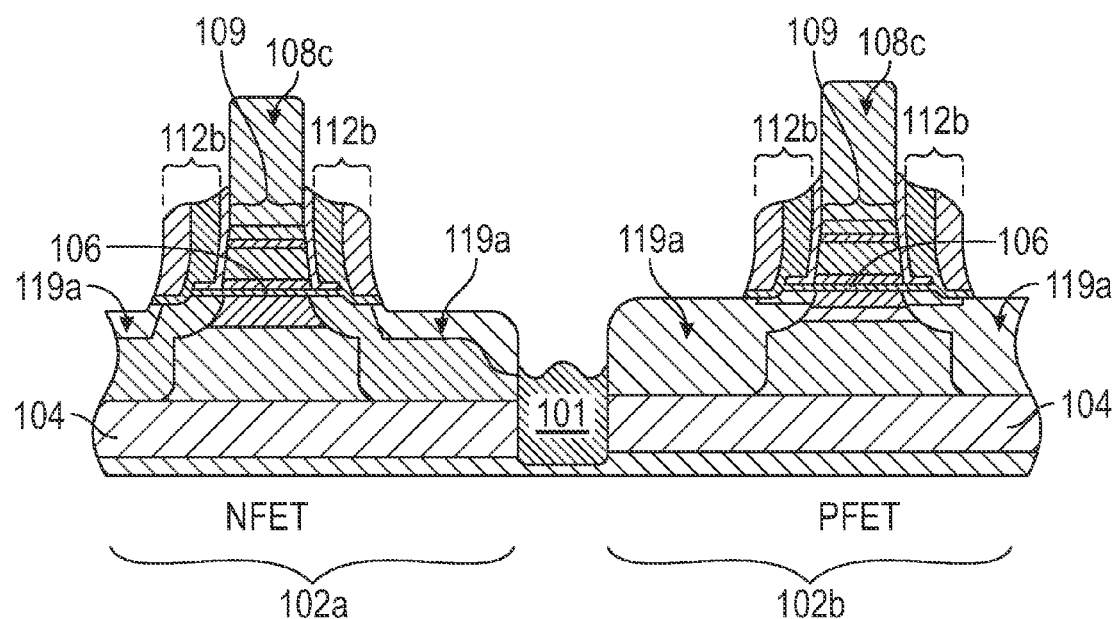

Thereafter, with reference now to FIG. 6, a single silicidation step may be performed by depositing a silicide-forming material layer 143, such as a nickel or other metal silicide-forming material, over the top portion of each of the two gate electrode structures 108b, the sidewalls of the upper portion of each of the two gate electrode structures 108a, the remaining portion of the sidewall spacers 112b, and the source and drain regions 119. As shown thereafter in FIG. 7, the silicide-forming layer 143 is annealed using conventional annealing processes (such as using temperatures greater than about 500° C.) to form both the gate and source/drain silicides simultaneously. For example, pre-annealing may be performed to provide the required diffusion, followed by removing the unreacted metal, and then annealing the semiconductor structure to form a more stable silicide phase. The deposited metal 143 reacts with the exposed polysilicon gate electrode 108 to transform the polysilicon gate fully into a silicided gate 108c (FUSI), and the deposited metal 143 reacts with the source/drain regions 119 to form silicided regions 119a thereover.

Although not illustrated, with regard to any of the embodiments described above, the partially-formed integrated circuit is completed in a conventional manner by, for example, providing electrical contacts to the silicided source and drain regions 119a and to the FUSI gate electrodes 108c, depositing interlayer dielectrics, etching contact vias, filling the contact vias with conductive plugs, and the like as are well known to those of skill in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of a functional integrated circuit, as are known in the art.

Thus, embodiments of the present disclosure provide methods for fabricating integrated circuits with fully silicided gate electrode structures. In contrast to conventional gate silicidation techniques, which only expose enough of the gate structure to form a silicide region on a top portion of the gate structure, or which use separate silicidation processes at the gate region and at the source/drain region, the embodiments described herein provide methods to "pull back" (i.e., reduce the height of) the gate sidewall spacers far enough to enable FUSI gates structures from the sides of the gate electrode while simultaneously forming the silicide for the source/drain region. By pulling back the spacer structures to expose the gate electrode, while leaving a portion of the spacer structures in place, the above-noted problem of "piping" is substantially avoided at the source/drain region, thus reducing defects in the completed semiconductor device.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   providing a gate electrode structure overlying a semiconductor substrate and sidewall spacers along sidewalls of the gate electrode structure to a first height along the sidewalls;
   forming a planarizing carbon-based polymer layer over the gate electrode structure and over the sidewall spacers;
   etching a portion of the planarizing carbon-based polymer layer to expose a top portion of the gate electrode structure and an upper portion of the sidewall spacers, the upper portion of the sidewall spacers being adjacent to sidewalls of an upper portion of the gate electrode structure;
   etching the upper portion of the sidewall spacers selective to the gate electrode structure so as to expose the sidewalls of the upper portion of the gate electrode structure;
   etching a remaining portion of the planarizing carbon-based polymer layer so as to expose a remaining portion of the sidewall spacers;
   depositing a silicide-forming material over the top portion of the gate electrode structure, the sidewalls of the upper portion of the gate electrode structure, and the remaining portion of the sidewall spacers; and
   annealing the silicide-forming material to form a fully silicided gate electrode structure.

2. The method of claim 1, wherein providing the semiconductor substrate comprises providing a semiconductor substrate and two gate electrode structures formed thereon, wherein one of the two gate electrode structures is an n-type gate electrode structure and wherein the other of the two gate electrode structures is a p-type gate electrode structure.

3. The method of claim 1, wherein providing the semiconductor substrate comprises providing a semiconductor substrate having a gate electrode structure thereover wherein the sidewall spacers of the gate electrode structure comprise a first sidewall spacer material disposed adjacent to a second sidewall spacer material.

4. The method of claim 1, wherein etching the portion of the planarizing carbon-based polymer layer comprises etching the optical planarization layer using reactive ion etching.

5. The method of claim 4, wherein etching a portion of the planarizing carbon-based polymer layer comprises etching the planarizing carbon-based polymer layer using $O_2$-based reactive ion etching.

6. The method of claim 1, wherein etching the upper portion of the sidewall spacers comprises exposing the gate electrode structure above a second height along the sidewalls, wherein the second height is below the first height.

7. The method of claim 6, wherein etching the upper portion of the sidewall spacers comprises etching the upper portion of the sidewall spacers using reactive ion etching.

8. The method of claim 7, wherein etching the upper portion of the sidewall spacers comprises etching the upper portion of the sidewall spacers using fluorine-based reactive ion etching.

9. The method of claim 6, wherein etching the upper portion of the sidewall spacers comprises etching the upper portion of the sidewall spacers using a wet etchant.

10. The method of claim 9, wherein etching the upper portion of the sidewall spacers comprises etching the upper portion of the sidewall spacer using a hydrogen fluoride-based wet etchant.

11. The method of claim 1, wherein etching the remaining portion of the planarizing carbon-based polymer layer comprises etching the remaining portion of the planarizing carbon-based polymer layer using an $O_2$ plasma.

12. The method of claim 1, wherein depositing the silicide-forming material comprises depositing a nickel silicide-forming material.

13. The method of claim 1, wherein providing the semiconductor substrate and the gate electrode structure comprises providing a semiconductor substrate having thereover a polycrystalline silicon gate electrode structure.

14. The method of claim 1, wherein forming the planarizing carbon-based polymer layer comprises forming a non-photo sensitive spin-on optical planarization layer (OPL).

15. The method of claim 1, wherein providing the semiconductor substrate comprises providing a semiconductor substrate having source and drain regions within the substrate aligned to the gate electrode structure.

16. The method of claim 15, wherein forming the planarizing carbon-based polymer layer further comprises forming the planarizing carbon-based polymer layer over the source and drain regions.

17. The method of claim 16, wherein etching the remaining portion of the planarizing carbon-based polymer layer further comprises exposing the source and drain regions.

18. The method of claim 17, wherein depositing the silicide-forming material further comprises depositing the silicide-forming material over the source and drain regions.

19. A method for fabricating an integrated circuit comprising:
   providing a polycrystalline silicon gate electrode structure overlying a semiconductor substrate, sidewall spacers along sidewalls of the gate electrode structure to a first height along the sidewalls, and source and drain regions within the semiconductor substrate aligned to the gate electrode structure;
   forming a non-photo sensitive spin-on polymer optical planarization layer over the gate electrode structure, over the sidewall spacers, and over the source and drain regions;
   etching a portion of the optical planarization layer using an $O_2$-based reactive ion etch to expose a top portion of the gate electrode structure and an upper portion of the sidewall spacers, the upper portion of the sidewall spacers being adjacent to sidewalls of an upper portion of the gate electrode structure;
   etching the upper portion of the sidewall spacers using a hydrogen fluoride-based wet etchant selective to the gate electrode structure so as to expose the sidewalls of the upper portion of the gate electrode structure, above a second height along the sidewalls, wherein the second height is below the first height;
   etching a remaining portion of the optical planarization layer using an $O_2$-based plasma so as to expose a remaining portion of the sidewall spacers and the source and drain regions;
   depositing a nickel silicide-forming material over the top portion of the gate electrode structure, the sidewalls of the upper portion of the gate electrode structure, the remaining portion of the sidewall spacers, and the source and drain regions; and
   annealing the silicide-forming material to form a fully silicided gate electrode structure and silicided source and drain regions.

20. A method for fabricating an integrated circuit comprising:
   providing a semiconductor substrate;

forming two polycrystalline silicon a gate electrode structure on the semiconductor substrate, wherein the substrate underneath one of the two gate electrode structures is doped with a p-type dopant and the substrate underneath the other of the at least two gate electrode structure is doped with an n-type dopant;

forming sidewall spacers comprising two different materials along sidewalls of the two gate electrode structures to a first height along the sidewalls;

forming source and drain regions on the semiconductor substrate aligned to the two gate electrode structures;

forming a non-photo sensitive spin-on polymer optical planarization layer over the two gate electrode structures, over the sidewall spacers, and over the source and drain regions;

etching a portion of the optical planarization layer using an $O_2$-based reactive ion etch to expose a top portion of each of the two gate electrode structures and an upper portion of the sidewall spacers, the upper portion of the sidewall spacers being adjacent to sidewalls of an upper portion of each of the two gate electrode structures;

etching the upper portion of the sidewall spacers using a hydrogen fluoride-based wet etchant selective to the two gate electrode structures so as to expose the sidewalls of the upper portions of each of the two gate electrode structure, above a second height along the sidewalls, wherein the second height is below the first height;

etching a remaining portion of the optical planarization layer using an $O_2$-based plasma so as to expose a remaining portion of the sidewall spacers and the source and drain regions;

depositing a nickel silicide-forming material over the top portion of each of the two gate electrode structures, the sidewalls of the upper portion of each of the two gate electrode structures, the remaining portion of the sidewall spacers, and the source and drain regions; and annealing the silicide-forming material to form two fully silicided gate electrode structures and silicided source and drain regions.

* * * * *